(12) United States Patent
Ding et al.

(10) Patent No.: US 11,885,041 B2
(45) Date of Patent: Jan. 30, 2024

(54) METHOD FOR INCREASING LUMINESCENCE UNIFORMITY AND REDUCING AFTERGLOW OF CE-DOPED GADOLINIUM-ALUMINUM-GALLIUM GARNET STRUCTURE SCINTILLATION CRYSTAL, CRYSTAL MATERIAL AND DETECTOR

(71) Applicant: CHINA ELECTRONICS TECHNOLOGY GROUP CORPORATION NO. 26 RESEARCH INSTITUTE, Chongqing (CN)

(72) Inventors: Yuchong Ding, Chongqing (CN); Jingjing Qu, Chongqing (CN); Qiang Wang, Chongqing (CN); Lu Wang, Chongqing (CN)

(73) Assignee: CHINA ELECTRONICS TECHNOLOGY GROUP CORPORATION NO. 26 RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 18/028,572

(22) PCT Filed: May 27, 2021

(86) PCT No.: PCT/CN2021/096212
§ 371 (c)(1),
(2) Date: Mar. 27, 2023

(87) PCT Pub. No.: WO2022/068229
PCT Pub. Date: Apr. 7, 2022

(65) Prior Publication Data
US 2023/0287595 A1    Sep. 14, 2023

(30) Foreign Application Priority Data

Sep. 30, 2020 (CN) .......................... 202011065989.6

(51) Int. Cl.
C30B 29/28 (2006.01)
C30B 15/04 (2006.01)
G01T 1/202 (2006.01)

(52) U.S. Cl.
CPC .............. C30B 29/28 (2013.01); C30B 15/04 (2013.01); G01T 1/2023 (2013.01)

(58) Field of Classification Search
CPC ........ C30B 29/28; C30B 15/04; G01T 1/2023
See application file for complete search history.

(56) References Cited

U.S. PATENT DOCUMENTS 5,057,692 A * 10/1991 Greskovich ........... G01T 1/2023
250/363.04
5,391,876 A * 2/1995 Tsoukala ................ G01T 1/2985
250/361 R
(Continued)

FOREIGN PATENT DOCUMENTS

CN    101638578 A    2/2010
CN    103374351 A    10/2013
(Continued)

OTHER PUBLICATIONS

International Search Report for corresponding application PCT/CN2021/096212 filed May 27, 2021; dated Sep. 1, 2021.

*Primary Examiner* — Hugh Maupin
(74) *Attorney, Agent, or Firm* — Gang Yu

(57) ABSTRACT

The present disclosure provides a method for increasing luminescence uniformity and reducing afterglow of a Ce-doped gadolinium-aluminum-gallium garnet structure scintillation crystal, a crystal material and a detector. Sc ions are doped into the crystal material, and the Sc ions occupy at (Continued)

least an octahedral site. The effective segregation coefficient of active Ce ions is increased by a radius compensation effect of Sc—Ce ions and adjustment of lattice parameters, thereby the luminescence uniformity of the crystal is increased and the energy resolution is optimized; and at the same time, the potential barrier for Gd ions entering the octahedral site is increased, thereby the probability of the Gd ions entering the octahedral site is reduced, the density of point defects in the crystal is decreased, and the afterglow intensity is reduced. A general formula of the Ce-doped gadolinium-aluminum-gallium garnet structure scintillation crystal is $\{Gd_{1-x-y-p}Sc_xCe_yMe_p\}_3[Al_{1-q}]_5O_{12}$, $0<x\leq0.1$, $0<y<0.02$, $0\leq p\leq0.02$, $0.4\leq q\leq0.7$.

8 Claims, 1 Drawing Sheet

(56) References Cited

U.S. PATENT DOCUMENTS

| | | | |
|---|---|---|---|
| 10,197,685 B2* | 2/2019 | Cohen | C30B 29/28 |
| 11,242,484 B2* | 2/2022 | Menge | G01T 1/202 |
| 2010/0294939 A1* | 11/2010 | Kuntz | C04B 35/01 |
| | | | 250/361 R |
| 2016/0170043 A1* | 6/2016 | Andreaco | G01T 1/2002 |
| | | | 250/368 |
| 2016/0312117 A1* | 10/2016 | Wieczorek | G01T 1/2985 |
| 2019/0169499 A1* | 6/2019 | Cohen | C09K 11/7774 |

FOREIGN PATENT DOCUMENTS

| | | |
|---|---|---|
| CN | 105008487 A | 10/2015 |
| CN | 109444945 A | 3/2019 |
| CN | 112281215 A | 1/2021 |
| JP | 2012184397 A | 9/2012 |

* cited by examiner

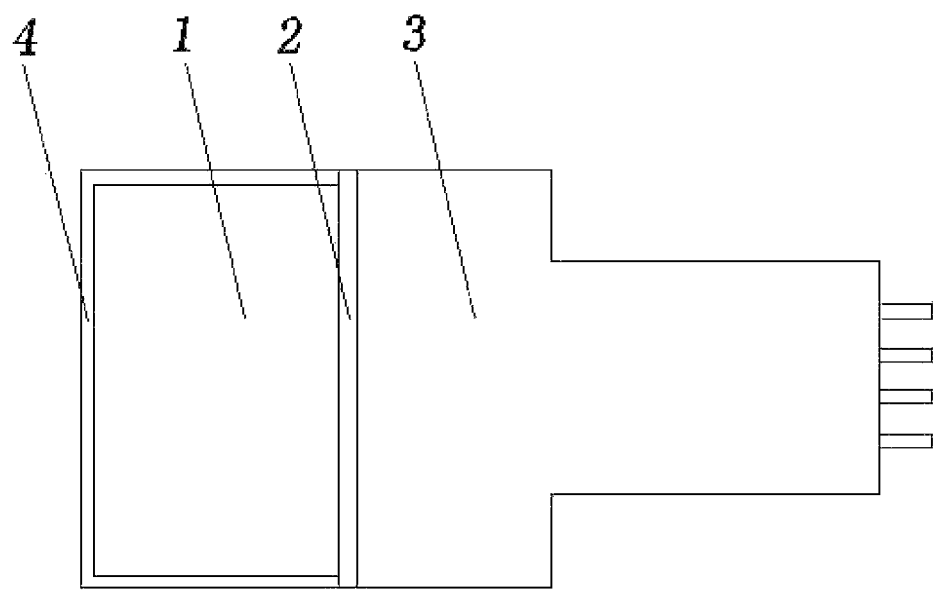

METHOD FOR INCREASING LUMINESCENCE UNIFORMITY AND REDUCING AFTERGLOW OF CE-DOPED GADOLINIUM-ALUMINUM-GALLIUM GARNET STRUCTURE SCINTILLATION CRYSTAL, CRYSTAL MATERIAL AND DETECTOR

CROSS-REFERENCE TO RELATED APPLICATIONS

This application is based on Chinese Patent Application No. 202011065989.6, filed Sep. 30, 2020, which claims the benefit of priority to the Chinese Patent Application, which is incorporated by reference in its entirety herein.

TECHNICAL FIELD

The present disclosure relates to a scintillation crystal, in particular to a method for increasing luminescence uniformity and reducing afterglow of a Ce-doped gadolinium-aluminum-gallium garnet structure scintillation crystal, a crystal material and a detector, and belongs to the technical field of crystal materials.

BACKGROUND

The scintillation crystal is a material that converts X-rays, γ-rays, α-particles, β-rays, neutrons and other charged ions into ultraviolet or visible light photons, and is widely used in medical imaging devices such as positron emission tomography (PET), single photon emission computed tomography (SPECT), and X-ray computed tomography (X-CT), as well as in petroleum logging, industrial non-destructive testing, security inspection and nuclide identification. In the above applications, the scintillation crystal is usually required to have high density, large effective atomic number, short decay time and good physicochemical property. The scintillation crystal is also required to have good energy resolution, especially for PET, SPECT, petroleum logging and nuclide identification applications. The scintillation crystal is also required to have low afterglow in X-CT, industrial non-destructive testing and security inspection applications.

In recent years, a Ce ion-doped gadolinium-aluminum-gallium garnet structure scintillation crystal (Ce:GAGG or Ce:GGAG for short) has been reported, such as a new-type garnet structure scintillation crystal composed of three types of Gd, Al and Ga cations and O atoms as main elements, which was disclosed in a document "Composition Engineering in Cerium-Doped $(Lu,Gd)_3(Ga,Al)_5O_{12}$ Single-Crystal Scintillators" published by K. Kamada et al., where Gd atoms mainly occupy a dodecahedral site, and Ga and Al atoms mainly occupy octahedral site and tetrahedral site. In particular, the energy band structure may be optimized by adjusting the ratio of Ga to Al, so that the light output of the crystal may reach more than 42000 photons/MeV, and the decay time may be controlled within 100 ns. Subsequently, US patent US2015/0353822 disclosed that the scintillation performance was further optimized by co-doping B, Ca, Ba and other bivalent or trivalent cations on the basis of the above garnet structure scintillation crystal. For example, the light output may be increased to 60000 photons/eV by doping B, and the decay time may be reduced to 50 ns by doping Ca; and it was disclosed in a document "Effect of $Mg^{2+}$ ions co-doping on timing performance and radiation tolerance of Cerium doped $Gd_3Al_3Ga_3O_{12}$ crystals" published by M. T. Lucchini et. al. in Nuclear Instruments and Methods in Physics Research A 816 (2016) 176-183 that the afterglow of the crystal may be reduced to about 0.1% @ 100 ms by co-doping Mg/Ce.

The above garnet structure scintillation, crystal composed of Gd, Al, Ga and O as the main elements all use Ce ions as active ions, and the main function of the active ion is to absorb the energy deposited in the crystal by detected particles (X-rays, γ-rays, α-particles etc.) and emit the ultraviolet or visible light photons. Therefore, the concentration of the Ce ions in the crystal directly affects the light output of the crystal, while the concentration distribution of the Ce ions affects the uniformity of the light output of the crystal. A general method for preparing the above garnet structure scintillation crystal is a melt method (including Czochralski method, Bridgman method, edge-defined film-fed growth method etc.), and this type of growth methods is to grow the crystal from a melt conservative system, namely: the total amount of materials in the crystal and the melt always remains unchanged. In the process of crystal growth, the Ce ion replaces the Gd ion by displacement to enter the dodecahedral site. Because the radius of the Ce ion is larger than that of the Gd ion, and the electronegattivity is different, a segregation phenomenon may occur. The segregation phenomenon causes that the concentration of the Ce ions entering the crystal site is significantly lower than that of the Ce ions in the melt. In the growth process, the concentration of the Ce ions entering the crystal site is increased with the enrichment of the concentration of the Ce ions in the melt, namely the concentration distribution is increased with the increase of the crystallization ratio (g) in the crystal. This uneven distribution of the Ce ion concentration is an important reason for the caused non-uniformity of crystal luminescence. On the one hand, the non-uniformity of crystal luminescence may reduce the utilization rate of the crystal (generally, a part with the lower luminescence in the crystal is removed and unused), and on the other hand, it may degrade the energy resolution of the crystal, especially the influence on the energy resolution of a large-volume crystal is more significant.

The strength of the Ce ion segregation effect is characterized by an effective segregation coefficient crystal, and $C_L(Ce)$ is the concentration of the Ce ions in the melt. The closer K is to 1, the distribution of the Ce ions in the crystal is more uniform, and the luminescence uniformity of the crystal is higher. $K_{eff}$ mainly depends on equilibrium segregation coefficient (K), growth environment and conditions, and is mainly determined by K in the case that the growth environment and the conditions remain unchanged. Generally the larger K is, and the larger $K_{eff}$ is. As an important thermodynamic parameter, K is uniquely determined by crystal compositions. The effective segregation coefficient $K_{eff}(Ce)$ was ~0.2 of the garnet structure scintillation crystal composed of Gd, Al, Ga and O as the main elements disclosed in existing patents and documents show that the segregation effect of the Ce ions is significant, it not only easily causes constitutional supercooling during the growth, increases the crystal defect density, but also leads to uneven concentration distribution of the Ce ions in the crystal (as described above, it may cause the non-uniformity of crystal luminescence). Both the increase of the crystal defect density and the uneven concentration distribution of the Ce ions may degrade the energy resolution of the crystal. The energy resolution of the Ce:GAGG crystal disclosed in the existing patents and documents may reach about 5% @ 662 keV optimally, but the volumes of crystals measured are all less than 1 $cm^3$, and it is not reported yet that the energy resolution of the crystal with the volume greater than dia. 1 inch×1 inch is better than 6% @ 662 keV. The reason why the energy resolution of the Ce:GAGG crystal is decreased with the increase of the crystal volume is not only the enhancement of self-absorption caused by the large volume, but also the non-uniformity of the light output caused by the uneven concentration distribution of the Ce ions.

The garnet structure scintillation crystal composed of Gd, Al, Ga and O as the main elements disclosed in the existing patents and documents has non-equilibrium replacement of rare earth ions into the octahedral site, and this non-equilibrium replacement may form the point defect in the crystal of capturing a carrier. If the energy bound in the point defect is transferred to a luminous center, it may produce afterglow. The afterglow may cause piling up of a detector, and cause image blurring in applications such as X-CT and industrial non-destructive testing device.

SUMMARY

In view of problems that an existing Ce-doped gadolinium-aluminum-gallium garnet structure scintillation crystal has uneven luminescence and strong afterglow while prepared by a melt method, a purpose of the present disclosure is to provide a method for increasing luminescence uniformity and reducing afterglow of a Ce-doped gadolinium-aluminum-gallium garnet structure scintillation crystal.

The present disclosure further provides a Ce-doped gadolinium-aluminum-gallium garnet structure scintillation crystal material which is benefit to increase luminescence uniformity and reduce afterglow, as well as a detector based on the scintillation crystal.

In order to achieve the above purpose, technical schemes adopted by the present disclosure are as follows.

A method for increasing luminescence uniformity and reducing afterglow of a Ce-doped gadolinium-aluminum-gallium garnet structure scintillation crystal is disclosed, comprises: doping Sc ions with a ionic radius between Gd ion and Ga ion into the Ce-doped gadolinium-aluminum-gallium garnet structure scintillation crystal, so that the Sc ions at least occupy an octahedral site, and the effective segregation coefficient of active Ce ions is increased by means of a radius compensation effect of Sc—Ce ions and adjustment of lattice parameters, thereby the luminescence uniformity of the scintillation crystal is increased and the energy resolution is optimized; and at the same time, the potential barrier for Gd ions entering the octahedral site is increased by Sc ion doping, thereby the probability of the Gd ions entering the octahedral site is reduced, the density of point defects in the scintillation crystal is decreased, and the afterglow intensity is reduced.

Further, the Se ions occupy the octahedral site and dodecahedral site at the same time.

Furthermore, the Ce-doped gadolinium-aluminum-gallium garnet structure scintillation crystal is doped with a Me ion, and the Me ion is selected from one or more of a group consisting of Mg, Ca and Li.

The present disclosure further provides a Ce-doped gadolinium-aluminum-gallium garnet structure scintillation crystal, and its chemical composition general formula is $\{Gd_{1-x-y-p}Sc_xCe_yMe_p\}_3[Al_{1-q}Ga_q]_5O_{12}$, and in the general formula, Me is selected from one or more of a group consisting of Mg, Ca and Li, where: $0<x\leq0.1$, $0<y\leq0.02$, $0\leq p\leq0.02$, $0.4\leq q\leq0.7$.

Preferably, $0.01\leq x\leq0.05$, $0.002\leq y\leq0.01$, $0\leq p\leq0.003$, $0.5\leq q\leq0.6$.

The present disclosure further provides, a scintillation crystal detector, includes a scintillation crystal and a photoelectric device, where the scintillation crystal is connected with the photoelectric device by an optical medium, the scintillation crystal is the above Ce-doped gadolinium-aluminum-gallium garnet structure scintillation crystal, and a reflective material is arranged on the surface of the scintillation crystal.

The surface roughness Ra of the crystal is $R_a \leq 200$ Å, the reflective material is an enhanced specular reflector (ESR) film, a mixture of $TiO_2$ powder and epoxy resin, a mixture of $BaSO_4$ powder and epoxy resin, or a mixture of MgO powder and epoxy resin, or a mixture of any two or three of $TiO_2$ powder, $BaSO_4$ powder and MgO powder and epoxy resin, and the particle size R of $TiO_2$ powder, $BaSO_4$ powder and MgO powder is: 5 nm<R<100 μm.

The particle size R of $TiO_2$ powder, $BaSO_4$ powder and MgO powder is: 100 nm<R<10 μm.

The photoelectric device is a silicon photomultiplier (SiPM), a photomultiplier (PMT), a photodiode (PD) or an avalanche photodiode (APD).

The optical medium is silicone oil or epoxy optical adhesive, and a refractive index n of the optical medium is >1.4.

Compared with existing technologies, the present disclosure has the following beneficial effects.

After doping the Sc ions into the garnet structure scintillation crystal material composed of Gd, Al, Ga and O as the main elements in the present disclosure, it can increase the effective segregation coefficient of the Ce ions effectively, reduce the non-equilibrium replacement of the Gd ions at the octahedral site, and optimize the luminescence uniformity, energy resolution and afterglow characteristics of the crystal by means of a radius compensation effect of the Sc ions and a adjustment of lattice parameters.

BRIEF DESCRIPTION OF THE DRAWINGS

FIG. 1 is a structure schematic diagram of a scintillation crystal detector based on a scintillation crystal provided by the present disclosure.

In FIG. 1, 1 denotes a scintillation crystal; 2 denotes a optical medium; 3 denotes a photoelectric device; and 4 denotes a reflective material.

DETAILED DESCRIPTION OF THE EMBODIMENTS

The present disclosure provides a garnet structure scintillation crystal composed of Gd, Al, Ga and O as main elements, Which is co-doped with Ce/Sc ions. By doping Sc ions with the ionic radius between Gd ion and Ga ion into the Ce:GAGG or Ce:GGAG crystal, and depending on a radius compensation effect of Sc—Ce ions and adjustment of lattice parameters mainly, the effective segregation coefficient of active ions (Ce ions) is increased, and the density of point defects caused by the non-equilibrium replacement of Gd ions is reduced, thereby the luminescence uniformity of the crystal is increased, the energy resolution is optimized and the afterglow intensity is reduced.

A chemical composition general formula of the scintillation crystal provided by the present disclosure is: $\{Gd_{1-x-y-p}Sc_xCe_yMe_p\}_3[Al_{1-q}Ga_q]_5O_{12}$, where $0<x\leq0.1$, $0<y\leq0.02$, $0\leq p\leq0.02$, $0.4\leq q\leq0.7$. In the general formula, Me is selected from one or more of a group consisting of Mg, Ca and Li or it is undoped, namely p is 0.

In order to guarantee that the comprehensive performance indexes of the crystal such as light output, decay time, energy resolution and luminescence uniformity are good, and it is easy to prepare a high-quality single crystal by a melt method, the preferred range of x is: $0.01 \leq x \leq 0.05$; the preferred range of y is: $0.002 \leq y \leq 0.01$; the preferred range of p is: $0 \leq p \leq 003$: and the preferred range of q is: $0.5 \leq q \leq 0.6$.

In the general formula, the doping of Me ions may shorten the decay time of the crystal and reduce the afterglow intensity, while the doping of Se ions may further enhance this effect and improve the luminescence uniformity of the crystal. It is important to note that the doping of Me ions has a lower optical yield and poorer energy resolution than those without doping, and the energy resolution is also worse. Therefore, whether to dope the Me ions depends on the actual application scenario. For example, in the measurement of an energy spectrum, the energy resolution of the crystal is the first indicator of its concern, and at this time, it is not suitable to dope the Me ions, namely p=0; and in the application of time-of-flight positron emission tomography (PET), the coincidence time resolution of the system is the first indicator of its concern, and at this time, it is necessary to dope an appropriate amount of the Me ions to shorten the decay time of the crystal, namely p>0. However, whether to dope the Me ions or not, the doping of Se ions may further optimize the luminescence uniformity, energy resolution and afterglow intensity of the crystal.

In the general formula. Sc ions with the content of x do not only occupy the dodecahedral site. In fact, the Se ions occupy the octahedral site preferentially. Only while, the number of the Sc ions in the octahedral site reaches a certain characteristic value (x≥0.01), it may enter the dodecahedral site. Under normal conditions, the Sc ions occupy both the octahedral site and the dodecahedral site, it means that the Sc ions exist at both sites. The Sc ions occupying the dodecahedral site are replaced by Gd ions, and the radius of the Gd ion is between Ce ion and Sc ion ($R_{Ce} > R_{Gd} > R_{Sc}$). Therefore, after Sc enters the dodecahedral site, it is easier for Ce ions to enter the dodecahedral site by the radius compensation effect, namely it may increase the effective segregation coefficient of the Ce ions; and the Sc ions occupying the octahedral site are replaced by Ga ions, and because the Ga ionic radius is smaller than the Sc ionic radius, after the Sc ions enter the octahedral site, it may increase the lattice parameters, and also facilitate the Ce ions entering the dodecahedral site with the larger space, namely the effective segregation coefficient of the Ce ions is further increased.

In the general formula. Gd ions with the content of 1-x-y-p do not all occupy the dodecahedral site, and a small number of the Gd ions still enter the octahedral site, namely non-equilibrium replacement, an antisite defect is formed. The doping of Sc ions may reduce the probability of Gd ions entering the octahedral site, this is because the doping of the Sc ions increases the potential barrier of the Gd ions entering the octahedral site. Therefore, the doping of the Se ions may reduce the density of point defects in the crystal and weaken the afterglow.

The preparation method for the scintillation crystal provided by the present disclosure is mainly a melt method, including but not limited to Czochralski method (Cz), Bridgman method (Bridgman), horizontal directional crystallization method (HDC), edge-defined film-fed growth method (EFG) and the like. In order to obtain a high-quality single crystal with a large size, the preferred preparation method is the Czochralski method.

The use form of the scintillation crystal provided by the present disclosure may be a crystal column, a crystal sheet, a crystal block or a crystal, array, and it is connected with a photoelectric device 3 by an optical medium 2. A reflective material 4 is arranged on the surface of the scintillation crystal 1, to form a scintillation crystal detector, and its structure is shown in FIG. 1.

The surface roughness Ra of the crystal is Ra≤200 Å, the reflective material may be an ESR film, a mixture of $TiO_2$ powder and epoxy resin, a mixture of $BaSO_4$ powder and epoxy resin, or a mixture of MgO powder and epoxy resin, or a mixture of any two or three of $TiO_2$ powder, $BaSO_4$ powder and MgO powder and epoxy resin, and the particle size R of $TiO_2$ powder, $BaSO_4$ powder and MgO powder is: 5 nm<R<100 μm; and in order to obtain the higher reflectivity, the preferred range of the particle size is: 100 nm<R<10 μm. The above three types of powder may be mixed in any ratios, the volume ratio of the powder to the epoxy resin is controlled between 100:1 to 1:2, and the most preferred range is between 30:1 to 2:1.

The photoelectric device 3 is a silicon photomultiplier (SiPM), a photomultiplier (PMT), a photodiode (PD), an avalanche photodiode (APD) and the like. In order to obtain the better energy resolution, it is best to choose SiPM.

The optical medium 2 connected with the scintillation crystal 1 and the photoelectric device 3 is silicone oil epoxy optical adhesive and the like, and its refractive index n is >1.4.

The scintillation crystal provided by the present disclosure may be used for detection of X-rays, γ-rays, electrons, neutrons, α-ions and other charged ions. The specific application fields contain: PET, SPECT, petroleum logging, security inspection, industrial CT, high-energy physics, nuclear physics and the like.

The difference between the present disclosure and Ce: GAGG or Ce: GGAG crystal reported in the existing documents or patents is that: the Sc ions occupy at least the octahedral site, and the best choice is that the Sc ions occupy both the octahedral site and the dodecahedral site. After the Sc ions enter the crystal site, on the one hand, it may increase the effective segregation coefficient of the Ce ions, and on the other hand, it may effectively inhibit the formation of Gd—Al antisite defects. By increasing the effective segregation coefficient of the Ce ions, the non-uniformity of Ce ion distribution in the crystal may be improved under the same crystallization ratio, and then the luminescence uniformity of the crystal is increased, and finally the energy resolution of the crystal is improved. This is essentially different from other methods to improve the luminescence uniformity and energy resolution of the crystal.

In addition, it is important to noted that: in the present disclosure, both of Sc and Ga two elements must exist in the crystal at the same time, and the Sc ions should occupy not only the octahedral site, but also the dodecahedral site, in order to obtain the excellent energy resolution and luminescence uniformity; the concentration range of Sc ion doping in the present disclosure shall satisfy: $0 \leq x \leq 0.1$. After the Se ions enter the crystal site, on the one hand, it may increase the effective segregation coefficient of the Ce ions, and on the other hand, it may effectively inhibit the formation of Gd—Al antisite defects. If x>0.1, it may cause the conduction band bottom of the crystal to move up, then reduce the light output of the crystal, so the good energy resolution may not be obtained; and the present disclosure proposes that in order to obtain the good energy resolution and luminescence uniformity, it is necessary to guarantee that the effective segregation coefficient $K_{eff}$ of the Ce ions is ≥0.28. The present disclosure proposes that in order to further reduce the afterglow, intensity, it is better to doping the Me ion, and the Me ion is selected from one or more of a group consisting of Mg, Ca and Li; and in addition, the present disclosure may not contain Lu element, because β decay produced by $^{138}$Lu may cause the crystal to produce radioactive background.

The technical schemes and effects of the present disclosure are further described below in combination with embodiments and contrast examples.

Embodiment 1: $Gd_{0.98}Sc_{0.01}Ce_{0.01}Al_2Ga_3O_{12}$ Scintillation Crystal and Performance According to the raw material compositions specified in the chemical formula $Gd_{0.98}Sc_{0.01}Ce_{0.01}Al_2Ga_3O_{12}$, $Gd_2O_3$, $Sc_2O_3$, $CeO_2$, $Al_2O_3$ and $Ga_2O_3$ powder raw materials were weighed according to the stoichiometric ratio. The purity was 99.999%, and the total mass was 4.0 kg. A crystal with a diameter of 40 mm was grown by Czochralski method. In the growth process, a mixed gas of 98% of $N_2$ and 2% of $O_2$ was fed as a protective atmosphere. The pulling speed was 1 mm/h, the revolution speed was 15 rpm, the cooling time was 20 hours, and the crystallization ratio of the crystal was 43%. In order to compare the effects of doping the Sc ion on the effective segregation coefficient, luminescence uniformity, energy resolution and afterglow intensity of the crystal, the same size crystal with the $Gd_{0.99}Ce_{0.01}Al_2Ga_3O_{12}$ composition was grown by the same method and process parameters. About 10 g of a sample was respectively taken from heads of two crystals close to a seed crystal in order to test concentration of Ce ions, and the effective segregation coefficient was calculated; a sample of 5 mm×5 mm×5 mm was respectively taken from the head (crystallization ratio g≈2%) and tail (crystallization ratio g≈40%) of two crystals in order to test light output, decay time and afterglow, and the uniformity of crystal light output was calculated; and a columnar crystal of Dia. 25 mm×25 mm was respectively cut from equal-diameter parts of two crystals in order to test the energy resolution. The samples for comparison were taken from the same part of different crystals, and it was guaranteed that all test conditions were consistent. Since the light output and energy resolution were related to the test conditions, and the effective segregation coefficient was related to the growth conditions and environment, all test results had only its relative significance. Its test results were shown in Table 1:

Embodiment 2: $Gd_{0.95}Sc_{0.04}Ce_{0.01}Al_2Ga_3O_{12}$ Scintillation Crystal and Performance According to the raw material compositions specified in, the chemical formula $Gd_{0.95}Sc_{0.04}Ce_{0.01}Al_2Ga_3O_{12}$, $Gd_2O_3$, $Sc_2O_3$, $Sc_2O_3$, $CeO_2$, $Al_2O_3$ powder raw materials were weighed according to the stoichiometric ratio. The purity was 99.999%, and the total mass was 4.0 kg. A crystal with a diameter of 40 mm was grown by Czochralski method. In the growth process, a mixed gas of 98% of $N_2$ and 2% of $O_2$ was fed as a protective atmosphere. The pulling speed was 1 mm/h, the revolution speed was 15 rpm, the cooling time was 20 hours, and the crystallization ratio of the crystal was 43%. In order to compare the effects of doping the Sc ion on the effective segregation coefficient, luminescence uniformity, energy resolution and afterglow intensity of the crystal, the same size crystal with the $Gd_{0.99}Ce_{0.01}Al_2Ga_3O_{12}$ composition was grown by the same method and process parameters. About 10 g of a sample was respectively taken from heads of two crystals close to a seed crystal in order to test the concentration of Ce ions, and the effective segregation coefficient was calculated; a sample of 5 mm×5 mm×5 mm was respectively taken from the head (crystallization ratio g≈2%) and tail (crystallization ratio g≈40%) of two crystals in order to test the light output, decay time and afterglow, and the uniformity of crystal light output was calculated; and a columnar crystal of Dia. 25 mm×25 mm was respectively cut from equal-diameter parts of two crystals in order to test the energy resolution. The samples for comparison were taken from the same part of different crystals, and it was guaranteed that all test conditions were consistent, Since the light output and energy resolution were related to the test conditions, and the effective segregation coefficient was related to the growth conditions and environment, all test results had only its relative significance. Its test results were shown in Table 2.

TABLE 1

Performance parameters of $Gd_{0.98}Sc_{0.01}Ce_{0.01}Al_2Ga_3O_{12}$ crystal

| Crystal composition | $Gd_{0.99}Ce_{0.01}Al_2Ga_3O_{12}$ | $Gd_{0.98}Sc_{0.01}Ce_{0.01}Al_2Ga_3O_{12}$ |
|---|---|---|
| Effective segregation coefficient | 0.21 | 0.29 |
| Head light output (photons/MeV) | 48500 | 48000 |
| Tail light output (photons/MeV) | 45000 | 46500 |
| Decay time (ns) | 138 | 140 |
| Afterglow intensity (@100 ms) | 0.6% | 0.4% |
| 1-inch sample energy resolution (@662 keV) | 8.1% | 6.3% |

TABLE 2

Performance parameters of $Gd_{0.95}Sc_{0.04}Ce_{0.01}Al_2Ga_3O_{12}$ crystal

| Crystal composition | $Gd_{0.99}Ce_{0.01}Al_2Ga_3O_{12}$ | $Gd_{0.95}Sc_{0.04}Ce_{0.01}Al_2Ga_3O_{12}$ |
|---|---|---|
| Effective segregation coefficient | 0.21 | 0.38 |
| Head light output (photons/MeV) | 48500 | 47500 |
| Tail light output (photons/MeV) | 45000 | 46500 |
| Decay time (ns) | 138 | 142 |
| Afterglow intensity (@100 ms) | 0.6% | 0.3% |
| 1-inch sample energy resolution (@662 keV) | 8.1% | 6.0% |

Embodiment 3:
$Gd_{0.978}Sc_{0.01}Mg_{0.001}Ce_{0.01}Al_2Ga_3O_{12}$ Scintillation Crystal and Performance According to the raw material compositions specified in the chemical formula $Gd_{0.979}Sc_{0.01}Mg_{0.001}Ce_{0.001}Al_2Ga_3O_{12}$, $Gd_2O_3$, $Sc_2O_3$, $CeO_2$, $Al_2O_3$, $Ga_2O_3$ and $MgCO_3$ powder raw materials were weighed according to the stoichiometric ratio. The purity was 99.999%, and the total mass was 4.0 kg. A crystal with a diameter of 40 mm was grown by Czochralski method. In the growth process, a mixed gas of 98% of $N_2$ and 2% of $O_2$ was fed as a protective atmosphere. The pulling speed was 1 mm/h, the revolution speed was 15 rpm, the cooling time was 20 hours, and the crystallization ratio of the crystal was 43%. In order to compare the effects of doping the Sc ion on the effective segregation coefficient, luminescence uniformity, energy resolution and afterglow intensity of the crystal, the same size crystal with the $Gd_{0.989}Mg_{0.001}Ce_{0.01}Al_2Ga_3O_{12}$ composition was grown by the same method and process parameters. About 10 g of a sample was respectively taken from heads of two crystals close to a seed crystal in order to test the concentration of Ce ions and the effective segregation coefficient was calculated; a sample of 5 mm×5 mm×5 mm was respectively taken from the head (crystallization ratio g≈2%) and tail (crystallization ratio g≈40%) of two crystals in order to test the light output, decay time and afterglow, and the uniformity of crystal light output was calculated; and a columnar crystal of Dia. 25 mm×25 mm was respectively cut from equal-diameter parts of two crystals in order to test the energy resolution. The samples for comparison were taken from the same part of different crystals, and it was guaranteed that all test conditions were consistent. Since the light output and energy resolution were related to the test conditions, and the effective segregation coefficient was related to the growth conditions and environment, all test results had only its relative significance. Its test results were shown in Table 3:

Embodiment 4:
$Gd_{0.949}Sc_{0.04}Mg_{0.001}Ce_{0.01}Al_2Ga_3O_{12}$ Scintillation Crystal and Performance According to the raw material compositions specified in the chemical formula $Gd_{0.949}Sc_{0.04}Mg_{0.001}Ce_{0.01}Al_2Ga_3O_{12}$, $Gd_2O_3$, $Sc_2O_3$, $CeO_2$, $Al_2O_3$, $Ga_2O_3$ and $MgCO_3$ powder raw materials were weighed according to the stoichiometric ratio. The purity was 99.999%, and the total mass was 4.0 kg. A crystal with a diameter of 40 mm was grown by Czochralski method. In the growth process, a mixed gas of 98% of $N_2$ and 2% of $P_2$ was fed as a protective atmosphere. The pulling speed was 1 mm/h, the revolution speed was 15 rpm, the cooling time was 20 hours, and the crystallization ratio of the crystal was 43%. In order to compare the effects of Se ion doping on the effective segregation coefficient, luminescence uniformity, energy resolution and afterglow intensity of the crystal, the same size crystal with the $Gd_{0.989}Mg_{0.001}Ce_{0.01}Al_2Ga_3O_{12}$ composition was grown by using the same method and process parameters. About 10 g of a sample was respectively taken from heads of two crystals close to a seed crystal in order to test the concentration of Ce ions, and the effective segregation coefficient was calculated: a sample of 5 mm×5 mm≈40%) of two crystals in order to test the light output, decay time and afterglow, and the uniformity of crystal light output was calculated; and a columnar crystal of Dia. 25 mm×25 mm was respectively cut from equal-diameter parts of two crystals in order to test the energy resolution. The samples for comparison were taken from the same part of different crystals, and it was guaranteed that all test conditions were consistent. Since the light output and energy resolution were related to the test conditions, and the effective segregation coefficient was related to the growth conditions and environment, all test results had only its relative significance. Its test results were shown in Table 3:

TABLE 3

Performance parameters of $Gd_{0.979}Sc_{0.01}Mg_{0.001}Ce_{0.01}Al_2Ga_3O_{12}$ crystal

| Crystal composition | $Gd_{0.989}Mg_{0.001}Ce_{0.01}Al_2Ga_3O_{12}$ | $Gd_{0.979}Sc_{0.01}Mg_{0.001}Ce_{0.01}Al_2Ga_3O_{12}$ |
|---|---|---|
| Effective segregation coefficient | 0.22 | 0.40 |
| Head light output (photons/MeV) | 42000 | 42000 |
| Tail light output (photons/MeV) | 38000 | 41000 |
| Decay time (ns) | 72 | 72 |
| Afterglow intensity (@100 ms) | 0.03% | 0.02% |
| 1-inch sample energy resolution (@662 keV) | 9.0% | 7.6% |

TABLE 4

Performance parameters of $Gd_{0.949}Sc_{0.04}Mg_{0.001}Ce_{0.01}Al_2Ga_3O_{12}$ crystal

| Crystal composition | $Gd_{0.989}Mg_{0.001}Ce_{0.01}Al_2Ga_3O_{12}$ | $Gd_{0.949}Sc_{0.04}Mg_{0.001}Ce_{0.01}Al_2Ga_3O_{12}$ |
|---|---|---|
| Effective segregation coefficient | 0.22 | 0.46 |
| Head light output (photons/MeV) | 42000 | 41000 |
| Tail light output (photons/MeV) | 38000 | 40500 |
| Decay time (ns) | 72 | 74 |
| Afterglow intensity (@100 ms) | 0.03% | 0.01% |
| 1-inch sample energy resolution (@662 keV) | 9.0% | 7.8% |

The above embodiments of the present disclosure are only examples listed to describe the present disclosure, not to limit implementation modes of the present disclosure. For those of ordinary skill in the art, other changes and variations in different forms may be made on the basis of the above descriptions. It is impossible to enumerate all the implementation modes here. All apparent changes or variations derived from the technical schemes of the present disclosure are still within a scope of protection of the present disclosure.

The invention claimed is:

1. A method for increasing luminescence uniformity and reducing afterglow of a Ce-doped gadolinium-aluminum-gallium garnet structure scintillation crystal, comprising: doping Sc ions with a ionic radius between Gd ion and Ga ion into the Ce-doped gadolinium-aluminum-gallium garnet structure scintillation crystal, so that the Sc ions occupy octahedral site and dodecahedral site at the same time, a chemical composition general formula of the obtained garnet structure scintillation crystal is $\{Gd_{1-x-y-p}Sc_xCe_yMe_p\}_3[Al_{1-q}Ga_q]_5O_{12}$, Me is selected from one or more of a group consisting of Mg, Ca and Li, $0.01 \leq x \leq 0.05$, $0.002 \leq y \leq 0.01$, $0 \leq p \leq 0.003$, $0.5 \leq q \leq 0.6$; wherein the Sc ions occupying the dodecahedral site substitute Gd ions with a ionic radius between Ce ions and Sc ions, after the Sc enters the dodecahedron lattice, it makes the Ce ions enter the dodecahedron lattice more easily depending on the radius compensation effect, increasing the effective segregation coefficient of the Ce ions;

the Sc ions occupying the octahedral site substitute the Ga ions with a ionic radius smaller than Sc ions, after entering the octahedral sites, the Sc ions increase lattice parameters, thereby facilitating the Ce ions to enter the dodecahedral sites with a larger space, and further increasing the effective segregation coefficient of the Ce ions;

and the effective segregation coefficient of active Ce ions is increased by means of a radius compensation effect of Sc—Ce ions and adjustment of lattice parameters, thereby the luminescence uniformity of the scintillation crystal is increased and the energy resolution is optimized; and at the same time, the potential barrier for Gd ions entering the octahedral site is increased by Sc ion doping, thereby the probability of the Gd ions entering the octahedral site is reduced, the density of point defects in the scintillation crystal is decreased, and the afterglow intensity is reduced.

2. The method for increasing luminescence uniformity and reducing afterglow of the Ce-doped gadolinium-aluminum-gallium garnet structure scintillation crystal according to claim 1, wherein the Ce-doped gadolinium-aluminum-gallium garnet structure scintillation crystal is doped with a Me ion, and the Me ion is selected from one or more of a group consisting of Mg, Ca and Li.

3. A Ce-doped gadolinium-aluminum-gallium garnet structure scintillation crystal, wherein a chemical composition general formula is $\{Gd_{1-x-y-p}Sc_xCe_yMe_p\}_3[Al_{1-q}Ga_q]_5O_{12}$, and in the general formula, Me is selected from one or more of a group consisting of Mg, Ca and Li, wherein: $0.01 \leq x \leq 0.05$, $0.002 \leq y \leq 0.01$, $0 \leq p \leq 0.003$, $0.5 \leq q \leq 0.6$.

4. A scintillation crystal detector, comprising a scintillation crystal and a photoelectric device, wherein the scintillation crystal is connected with the photoelectric device by an optical medium, the scintillation crystal is the Ce-doped gadolinium-aluminum-gallium garnet structure scintillation crystal according to claim 3, and a reflective material is arranged on the surface of the scintillation crystal.

5. The scintillation crystal detector according to claim 4, wherein the surface roughness Ra of the crystal is $R_a \leq 200$ Å, the reflective material is an enhanced specular reflector (ESR) film, a mixture of $TiO_2$ powder and epoxy resin, a mixture of $BaSO_4$ powder and epoxy resin, or a mixture of MgO powder and epoxy resin, or a mixture of any two or three of $TiO_2$ powder, $BaSO_4$ powder and MgO powder and epoxy resin, and the particle size R of $TiO_2$ powder, $BaSO_4$ powder and MgO powder is: 5 nm<R<100 μm.

6. The scintillation crystal detector according to claim 5, wherein the particle size R of $TiO_2$ powder, $BaSO_4$ powder and MgO powder is: 100 nm<R<10 μm.

7. The scintillation crystal detector according to claim 4, wherein the photoelectric device is a silicon photomultiplier, a photomultiplier, a photodiode or an avalanche photodiode.

8. The scintillation crystal detector according to claim 4, wherein the optical medium is silicone oil or epoxy optical adhesive, and a refractive index n of the optical medium is >1.4.

* * * * *